US008999905B2

(12) United States Patent
Duggal

(10) Patent No.: US 8,999,905 B2
(45) Date of Patent: Apr. 7, 2015

(54) LUBRICANT ADDITIVE

(75) Inventor: Akhilesh Duggal, Midlothian, VA (US)

(73) Assignee: Afton Chemical Corporation, Richmond, VA (US)

( * ) Notice: Subject to any disclaimer, the term of this patent is extended or adjusted under 35 U.S.C. 154(b) by 0 days.

(21) Appl. No.: 12/925,565

(22) Filed: Oct. 25, 2010

(65) Prior Publication Data

US 2012/0101017 A1    Apr. 26, 2012

(51) Int. Cl.
*C10M 143/10* (2006.01)
*C10M 143/12* (2006.01)

(52) U.S. Cl.
CPC ........... *C10M 143/12* (2013.01); *C10M 143/10* (2013.01); *C10N 2220/029* (2013.01); *C10M 2205/06* (2013.01); *C10M 2205/04* (2013.01); *C10N 2220/02* (2013.01); *C10N 2230/02* (2013.01); *C10N 2230/08* (2013.01); *C10N 2240/10* (2013.01); *H01L 2924/0002* (2013.01)

(58) Field of Classification Search
USPC ....................................................... 508/591
See application file for complete search history.

(56) References Cited

U.S. PATENT DOCUMENTS

| | | |
|---|---|---|
| 4,116,917 A | 9/1978 | Eckert |
| 4,358,565 A | 11/1982 | Eckert |
| 4,409,368 A | 10/1983 | Vitus et al. |
| 4,427,834 A | 1/1984 | Martin |
| 4,877,836 A | 10/1989 | Rhodes |
| 4,900,875 A | 2/1990 | Rhodes et al. |
| 5,035,820 A | 7/1991 | Rhodes et al. |
| 5,049,294 A | 9/1991 | Van Zon et al. |
| 5,070,131 A * | 12/1991 | Rhodes et al. ................ 524/484 |
| 5,141,996 A | 8/1992 | Zon et al. |
| 5,147,570 A | 9/1992 | Van Zon et al. |
| 5,149,895 A | 9/1992 | Coolbaugh et al. |
| 5,264,139 A | 11/1993 | Mishra et al. |
| 5,264,140 A | 11/1993 | Mishra et al. |
| 5,266,647 A | 11/1993 | Bender et al. |
| 5,288,937 A | 2/1994 | Coolbaugh et al. |
| 5,302,667 A | 4/1994 | Rhodes et al. |
| 5,360,564 A | 11/1994 | Sutherland et al. |
| 5,458,791 A | 10/1995 | Rhodes et al. |
| 5,460,739 A | 10/1995 | Rhodes et al. |
| 5,484,866 A | 1/1996 | Loveless et al. |
| 5,486,563 A | 1/1996 | Sutherland |
| 5,616,542 A | 4/1997 | Sutherland |
| 5,633,415 A | 5/1997 | Brandes et al. |
| 5,773,521 A | 6/1998 | Hoxmeier et al. |
| 5,798,418 A | 8/1998 | Quirk |
| 6,034,042 A | 3/2000 | Rhodes |
| 6,107,408 A | 8/2000 | Quirk et al. |
| 6,162,768 A | 12/2000 | Coolbaugh et al. |
| 6,303,550 B1 | 10/2001 | Wedlock et al. |
| 7,018,962 B2 | 3/2006 | Bloch et al. |
| 7,034,079 B2 | 4/2006 | Visger et al. |
| 7,163,913 B2 | 1/2007 | Briggs et al. |
| 7,625,851 B2 | 12/2009 | St. Clair |
| 7,691,797 B2 | 4/2010 | Schmidt et al. |
| 2005/0209408 A1 | 9/2005 | Lee et al. |
| 2008/0085847 A1 * | 4/2008 | Tse et al. ........................ 508/591 |
| 2010/0087559 A1 | 4/2010 | Kusanose et al. |

FOREIGN PATENT DOCUMENTS

| | | |
|---|---|---|
| CN | 1291223 A | 2/1998 |
| CN | 101161799 A | 4/2008 |
| DE | 19724914 | 3/2000 |
| EP | 0541180 | 5/1993 |
| EP | 1925657 A2 | 5/2008 |
| WO | 2011005741 | 1/2011 |

OTHER PUBLICATIONS

Extended European Search Report; Application No. 11186324.7-2104; dated Mar. 7, 2012; 5 pages.
Japanese Office Action; Application No. 2011-219130; Dispatched Nov. 5, 2013; 14 pages.
Second China Office Action; dated Jan. 16, 2014; Application No. 201110327158.6 dated Oct. 25, 2011; 15 pages.
Third China Office Action; mailed Jul. 30, 2014; Application No. 201110327158.6 dated Oct. 25, 2011; 12 pages.
Translation of first Office Action from Chinese Patent Office issued Apr. 3, 2013; Patent Application No. 201110327158.6, Application Date Oct. 25, 2011; 8 pages.

* cited by examiner

*Primary Examiner* — Taiwo Oladapo
(74) *Attorney, Agent, or Firm* — Wolf, Greenfield & Sacks, P.C.

(57) ABSTRACT

A hydrogenated styrene butadiene star copolymer is incorporated in a lubricant additive package. The star copolymer can include about 3 to 25% and about 97 to 75% butadiene. The star copolymer may further be incorporated in a lubricant additive in the amount of about 12 wt % of the star copolymer as compared to the base oil.

15 Claims, No Drawings

LUBRICANT ADDITIVE

FIELD OF INVENTION

The invention is directed to lubricant additives, and especially viscosity index improvers, useful in the formulation of engine lubricating oil compositions. More specifically, the present invention is directed to a lubricant additive that includes a styrene-butadiene star copolymer therein.

BACKGROUND

Lubricating oil compositions for use in crankcase engine oils include base oils and additives that improve the performance and increase the effective life of the lubricant. Crankcase lubricating oil compositions can contain various polymer components that may be used to improve the viscometric performance of the engine oil.

Polymers are used as viscosity index improvers and often comprise copolymers of ethylene and propylene, among others. A challenge for oil formulators is to find polymers that may both improve high temperature viscosity performance as well as improve low temperature performance such as cold engine starting performance. These attributes, among others, can cause performance tradeoffs with respect to given polymer additives wherein an improvement in one way can be offset by reduced performance in another. Additionally, there is always a commercial incentive to have the polymer be effective at the lowest reasonable concentrations in order to minimize the cost of a given engine oil product or additive.

SUMMARY OF INVENTION

Accordingly it is an object of the present invention to provide a lubricating oil additive and lubricating oil composition having improved viscometric performance. The invention includes the use of a hydrogenated styrene-butadiene star copolymer.

In one example, a lubricant comprises a viscosity index improver. The viscosity index improver comprises a hydrogenated styrene-butadiene star copolymer, wherein the star copolymer is formed from styrene and butadiene monomers in ratio of about 3 to 25% styrene to about 97 to 75% butadiene by weight. The degree of hydrogenation of the star copolymer is at least 95%. The lubricant additive further comprises one or more base oils, wherein the star copolymer comprises about 1 to 20 wt % of the viscosity index improver. Further, the lubricant has a mini-rotary viscometer (MRV TP-1) value improvement of at least 5000 cP over a lubricant containing a hydrogenated styrene isoprene star copolymer or an olefin copolymer diluted with the same base oil at approximately the same dilution level as the VI improver described in (a), at generally equivalent kinematic viscosity at 100° C. Alternatively, the hydrogenated star copolymer may have at least 98% degree of hydrogenation or, alternatively, at least 99% degree of hydrogenation. The ratio of styrene and butadiene monomers may be about 5 to 20% styrene to about 95 to 80% butadiene, or alternatively, about 10% styrene and 90% butadiene. The star copolymer may be used in one example to comprise about 10 to 15 wt % of the viscosity index improver. The star copolymer may be a hydrogenated, random styrene-butadiene copolymer or, alternatively, a hydrogenated styrene-butadiene block copolymer. The lubricant may have a mini-rotary viscometer value improvement of at least 8000 cP. The star copolymer may comprise about 0.1 to 5 wt % of the lubricant. The lubricant may comprise one or more Group I, Group II, Group III or Group IV oil, or mixtures thereof.

In another alternative, the invention includes a method of preparing a viscosity index improver. The method includes mixing a base oil with a hydrogenated styrene butadiene star copolymer, wherein the star copolymer is formed from styrene and butadiene in a ratio of about 3 to 25% styrene to about 97 to 75% butadiene by weight and the degree of hydrogenation is at least 95%.

DETAILED DESCRIPTION

The present invention is directed to a lubricant additive, specifically a viscosity index improver, comprising a hydrogenated styrene-butadiene star copolymer. The ratio of styrene to butadiene with respect to the monomers used in the formation of the star copolymer is about 3 to 25% styrene and 97 to 75% of butadiene, alternatively about 5 to 20% styrene and 95 to 80% butadiene. In one example, the styrene is approximately 10% and butadiene 90% of the result of the components in the star copolymer. This star copolymer is dissolved in a base oil at approximately 1 to 20 wt % of the star copolymer. The lubricant additive is then ready for use in a fully formulated crankcase motor oil.

The star copolymer described herein includes styrene-butadiene copolymer arms bonded, in one example, to a divinyl benzene core to form the multi-arm star copolymer. Turning first to the styrene-butadiene arms, as referenced above, the relative ratio of styrene and butadiene monomers used in the formation of the arms of the star is about 3 to 25% styrene and 97 to 75% butadiene, alternatively about 5 to 20% styrene and 95 to 80% butadiene, and in one example, approximately 10% styrene and 90% butadiene.

These copolymer arms may be formed in different ways, or in different combinations of ways in which to create specific copolymer arm structures. The copolymer may have a random, tapered, or block architecture or combinations thereof. For instance, the reaction that creates the styrene-butadiene copolymer may be completely random in that the styrene and butadiene monomers are all reacted together at the same time. The result is a random styrene-butadiene copolymer where the monomers are randomly distributed in copolymer arms. Alternatively, the styrene and butadiene may be joined together into a block copolymer format such that a multistep reaction is used. In each step, styrene or butadiene is sequentially joined to the arm of the preceding step to thereby form a block copolymer. In addition to the formation of straight random copolymers and block copolymers, it is possible to use a combination of reactions to form a partially random and partially block copolymer of styrene and butadiene. There may also be formed a tapered copolymer where the arm is composed of, at one end, a relatively pure first monomer and, at the other end, a relatively pure second monomer. The middle of the arm is more of a gradient composition of the two monomers. The choice of styrene butadiene copolymer may depend on the cost, commercial availability, ease of handling, and other processing attributes. Alternatively, the specific type of styrene butadiene copolymer may also depend on actual performance differences between the copolymers as a result of later testing of the variously-formed styrene butadiene copolymer arms.

In one example, the copolymer is prepared from anionic polymerization techniques. Initiators include, for example, hydrocarbyllithium initiators such as alkyllithium compounds (e.g., methyl lithium, n-butyl lithium, sec-butyl lithium), cycloalkyllithium compounds (e.g., cyclohexyl lithium) and aryl lithium compounds (e.g., phenyl lithium, 1-methylstyryl lithium, p-tolyl lithium, naphyl lithium and 1,1-diphenyl-3-methylpentyl lithium). Also, useful initiators include naphthalene sodium, 1,4-disodio-1,1,4,4-tetraphenylbutane, diphenylmethyl potassium or diphenylmethyl sodium.

The above polymerization process is carried out in the absence of moisture and oxygen and in the presence of at least one inert solvent. In one embodiment anionic polymerization is conducted in the absence of any impurity which is detrimental to an anionic catalyst system. The inert solvent includes a hydrocarbon, an aromatic solvent or ether. Suitable solvents include isobutene, pentane, cyclohexane, benzene, toluene, xylene, tetrahydrofuran, diglyme, tetraglyme, ortho-terphenyl, biphenyl, decalin or tetralin.

The copolymer with radial or star architecture typically contains polymeric arms that may be chemically bonded to a core portion. The core portion may be a polyvalent coupling agent such as a polyvalent divinyl non-acrylic monomer, oligomer polymer, or copolymer thereof, or silicon tetrachloride. In one embodiment the polyvalent divinyl non-acrylic monomer is divinyl benzene.

The amount of polyvalent coupling agent may be an amount suitable to provide coupling of copolymer previously prepared as arms onto a core comprising the coupling agent in monomeric, oligomeric, or polymeric form, to provide a star copolymer. As described above, suitable amounts may be determined readily by the person skilled in the art with minimal experimentation, even though several variables may be involved. For example, if an excessive amount of coupling agent is employed, or if excessive unreacted monomer from the formation of the polymeric arms remains in the system, crosslinking rather than star formation may occur. Typically the mole ratio of copolymer arms to coupling agent may be 50:1 to 1:1, or 30:1 to 2:1, or 20:1 to 4.1, or about 15:1 to 10:1. The desired ratio may also be adjusted to take into account the length of the arms, longer arms sometimes tolerating or requiring more coupling agent than shorter arms. Typically the material prepared is soluble in an oil of lubricating viscosity.

In one embodiment the polymeric arms of the copolymer have a polydispersity of 2 or less, or 1.7 or less, or 1.5 or less, for instance, 1 to 1.4 as measured before radial or star copolymer formation or on uncoupled units.

The overall composition containing polymers with the radial or star architecture may thus also have uncoupled polymeric arms present (also referred to as a polymer chain or linear polymer) the percentage conversion of a polymer chain to radial or star polymer may be at least 50%, for instance at least 70%, at least 75% or at least 80%. In one embodiment the conversion of polymer chain to radial or star copolymer may be 90%, 95% or about 100%. In one embodiment a portion of the polymer chains does not form a star copolymer and remains as a linear polymer. In one embodiment the polymer is a mixture of (i) a polymer with radial or star architecture, and (ii) linear polymer chains (also referred to as uncoupled polymeric arms). In different embodiments the amount of radial or star architecture within the polymer composition may be 10 wt % to 85 wt %, to 25 wt % to 70 wt % of the amount of polymer. In different embodiments the linear polymer chains may be present at 5 wt % to 90 wt %, or 30 wt % to 75 wt % of the amount of star copolymer.

The copolymer with radial or star architecture may have 3 or more arms, or 5 or more arms, or 7 or more arms, or 10 or more arms. In other embodiments, there may be 12 or more arms, or 20 or more arms. Generally, the number of arms ranges from 3 to 30, or alternatively from 4 to 20.

The molecular weight $M_w$ of the final star copolymer depends on the size and average number of arms on each molecule. In one example, the molecular weight of the star molecule is greater than 700,000, alternatively greater than 650,000, and still further greater than 600,000. The molecular weight of each arm on these star molecules is more than 70,000, alternatively more than 60,000, and still further alternatively more than 50,000.

The present star copolymer is a hydrogenated molecule. The degree of hydrogenation is greater than 99%, alternatively greater than 98%, and still further alternatively greater than about 95%. In the following examples, a titanium catalyst is used in the hydrogenation of the copolymer. Preferably, the hydrogenation step is carried out in accordance with the procedure disclosed in the European Patent Application EP 914,867 and European Patent Application EP 816,382.

In formulating a lubricant additive, and especially a viscosity index improver, the star copolymer described herein is added to a base oil of lubricating viscosity to form the lubricant additive. Oils of lubricating viscosity useful as the diluents of the present invention may be selected from natural lubricating oils, synthetic lubricating oils and mixtures thereof.

Natural oils include animal oils and vegetable oils (e.g., castor oil, lard oil); liquid petroleum oils and hydro-refined, solvent-treated or acid-treated mineral oils or the paraffinic naphthenic and mixed paraffinic-naphthenic types. Oils of lubricating viscosity derived from coal or shale also serve as useful base oils.

Synthetic lubricating oils include hydrocarbon oils and halo-substituted hydrocarbon oils such as polymerized and interpolymerized olefins, alkylbenzenes; polyphenyls; and alkylated diphenyl ethers and alkylated diphenyl sulfides and derivative, analogs and homologs thereof.

Alkylene oxide polymers, and interpolymers and derivatives thereof where the terminal hydroxyl groups have been modified by esterification, etherification, etc., constitute another class of known synthetic lubricating oil.

Another suitable class of synthetic lubricating oils comprises the esters of dicarboxylic acids with a variety of alcohols (e.g., butyl alcohol, hexyl alcohol, dodecyl alcohol, 2-ethylhexyl alcohol, ethylene glycol, diethylene glycol monoether, propylene glycol).

The diluent oil may comprise a Group I, Group II, Group II, Group IV or Group V oil or blends of the aforementioned oils. The diluent oil may also comprise a blend of one or more Group I oils and one or more of Group II, Group III, Group IV or Group V oil. Preferably, from an economic standpoint, the diluent oil is a mixture of a Group I oil and one or more a Group II, Group III, Group IV or Group V oil, more preferably a mixture of a Group I oil and one or more Group II or Group III oil.

Definitions for the oils as used herein are the same as those found in the American Petroleum Institute (API) publication "Engine Oil Licensing and Certification System", Industry Services Department, Fourteenth Edition, December 1996, Addendum 1, December 1998.

The star copolymer is added to the base oil to form a lubricant additive in a ratio of 1-20 wt %, alternatively 10-15 wt %, or still further alternatively about 12 wt %.

Ultimately, the lubricant additive will be used in connection with a fully formulated lubricant composition. The amount of lubricant additive that is used in the fully formulated lubricant composition is sufficient to provide about 0.1 to 5 wt % of star copolymer in the fully formulated lubricant composition. Alternatively, about 0.3 to 2 wt %, or still further alternatively approximately 0.5 to 1.5 wt % of the fully formulated lubricant.

It is possible and even desirable to include other types of additives in a fully formulated lubricant composition. These other additives may include detergents, dispersants, viscosity modifiers, friction modifiers, metal deactivators, dispersant viscosity modifiers, extreme pressure agents, antiwear agents, antioxidants, corrosion inhibitors, foam inhibitors, emulsifiers, pour point depressants, seal swelling agents and mixtures thereof. These other lubricant additives may be combined in varying amounts relative to each other.

EXAMPLE 1

Random Styrene-Butadiene Star Copolymer

The following process was used to create one example of a styrene/butadiene star copolymer and incorporate it into a base oil to form a lubricant additive. In this example there is a completely random polymerization of styrene and butadiene monomers.
  a. Butadiene (~90%) and styrene (~10%) were co-polymerized in a clean, oxygen and moisture free reactor at about 10% concentration and 30-70° C. in a cyclohexane solvent using n-butyl lithium as the catalyst, in the presence of tetrahydrofurane as a modifier to control the amount of 1,2 vs 1,4 polymerization of butadiene. The polymerization is completed in about 20 minutes. Next, divinyl benzene is added to the reactor in order to couple the polymers into a star structure. This takes about 60 minutes. Finally, tert-butanol is added to the reactants to neutralize any remaining active centers so that no further chain growth can take place.
  b. The star copolymer solution is then hydrogenated using a titanium catalyst at 120° C., wherein a 99+% degree of hydrogenation is achieved.
  c. The hydrogenated styrene-co-butadiene star copolymer is then recovered from the solution through a series of steam stripping, extrusion and drying steps.
  d. The dried hydrogenated styrene-co-butadiene star copolymer is dissolved in base oil at approximately 12 wt % polymer, by heating the solution to 120-150 C under a nitrogen atmosphere for 4-8 hours.

The foregoing process may be varied in many respects. The solvent into which the butadiene and styrene are polymerized is a cyclohexane solvent, but other inert solvents noted earlier herein are acceptable and may be used. Also the catalyst in this polymerization reaction is n-butyl lithium. Other lithium-based catalysts may be used. Also noted is the use of tetrahydrofurane as a modifier to control the amount of 1,2 versus 1,4 polymerization of butadiene. Other ether-based modifiers may likewise be used. It is preferred that the amount of 1,2 polymerization of butadiene constitutes more than about 50%, alternatively more than 53%, and still further alternatively more than 54% of the final polymer. If there is less than about 50% of the 1,2 butadiene polymer, then a crystalline copolymer forms that is undesirable.

The hydrogenated styrene-butadiene random copolymers formed herein were used as Product Examples R-1 and R-2 in Table 1.

EXAMPLE 2

Styrene-Butadiene Block Copolymer Star Polymer

The following process was used to create one example of a styrene/butadiene star copolymer and incorporate it into a base oil to form a lubricant additive. In this example, a star shaped block copolymer of styrene and butadiene is formed.
  a. Styrene (~10%) was polymerized in a clean, oxygen and moisture free reactor at about 10% concentration and 30-70° C. in a cyclohexane solvent using n-butyl lithium as the catalyst; after about 20 minutes, butadiene (~90%) is added to the reactor, in the presence of tetrahydrofurane as a modifier to control the amount of 1,2 vs 1,4 polymerization of butadiene. Further polymerization is completed in about 20 minutes. Next, divinyl benzene is added to the reactor in order to couple the polymers into a star structure. This takes about 60 minutes. Finally, tert-butanol is added to the reactants to neutralize any remaining active centers so that no further chain growth can take place.
  b. The star copolymer solution is then hydrogenated using a titanium catalyst at 120° C., wherein a 99+% degree of hydrogenation is achieved.
  c. The hydrogenated styrene-butadiene block star polymer is then recovered from the solution through a series of steam stripping, extrusion and drying steps.
  d. The dried hydrogenated styrene-butadiene block star copolymer is dissolved in base oil at approximately 12 wt % polymer, by heating the solution to 120-150 C under a nitrogen atmosphere for 4-8 hours.

The foregoing process may be varied in many respects. The solvent into which the butadiene and styrene are polymerized is a cyclohexane solvent, but other inert solvents noted earlier herein are acceptable and may be used. Also the catalyst in this polymerization reaction is n-butyl lithium. Other lithium-based catalysts may be used. Also noted is the use of tetrahydrofurane as a modifier to control the amount of 1,2 versus 1,4 polymerization of butadiene. This is a significant aspect of the reaction process. It is preferred that the amount of 1,2 polymerization of butadiene constitutes more than 50%, alternatively more than 53%, and still further alternatively more than 54% of the final copolymer. If there is less than 50% of the 1,2 butadiene polymer, then a crystalline polymer forms that is undesirable. Also above, the use of a titanium catalyst to achieve hydrogenation is useful. The titanium catalyst can simply be left in the end polymer and does not need to be removed.

The hydrogenated styrene-butadiene block copolymers formed herein were used as Product Examples B-1 and B-2 in Table 1.

LUBRICATING ADDITIVE AND FORMULATED LUBRICANT OIL EXAMPLES

The foregoing copolymers were used to formulate lubricant additive samples that were compared with commercially available benchmark products. The benchmark products are ShellVis 261 (SV-261) and Lubrizol Lz7077 (Lz7077). The following Table 1 is a description of the physical characteristics and performance attributes of the benchmarks versus the lubricant additives and fully formulated lubricant oil compositions as described herein.

TABLE 1

| | Product | | | | | |
|---|---|---|---|---|---|---|
| | SV-261 | Lz 7077 | Example R-1 | Example R-2 | Example B-1 | Example B-2 |
| | Description | | | | | |
| | Star Polymer, Hydrogenated Styrene-Isoprene Block Copolymer | Linear Polymer, Ethylene-Propylene Random Copolymer | Star Polymer, Hydrogenated Styrene-Butadiene Random Copolymer | Star Polymer, Hydrogenated Styrene-Butadiene Random Copolymer | Star Polymer, Hydrogenated Styrene-Butadiene Block Copolymer | Star Polymer, Hydrogenated Styrene-Butadiene Block Copolymer |
| Polymer Structure | | | | | | |
| Vinyl 1, 2, % | | NA | 53 | 55.7 | 51 | 54 |
| Hydrogenation, % | | NA | 99 | 99 | 98 | 99 |
| Wt % Styrene | ~7% | NA | 8.5 | 10.7 | 7.6 | 11 |
| Polymer Properties | | | | | | |
| Mw, Daltons | 599,000 | 160,000 | 703,000 | 702,000 | 576,000 | 556,000 |
| Mn, Daltons | 526,000 | 94,000 | 604,000 | 620,000 | 506,000 | 482,003 |
| Mw/Mn | 1.14 | 1.70 | 1.16 | 1.13 | 1.14 | 1.15 |
| VI Improver Concentrate Composition and Properties | | | | | | |
| Active Polymer, % | 11.6 | 12.4 | 12 | 12 | 12 | 12 |
| Base Oil (Group I), % | 88.4 | 87.6 | 88 | 88 | 88 | 88 |
| Kinematic Viscosity, cSt at 100 C. | 1463 | 1167 | 1325 | 1256 | 1104 | 805 |
| Thickening Power, 1 wt % Polymer | 6.22 | 4.15 | 5.93 | 5.86 | 5.32 | 4.72 |
| Shear Stability Index, % TP Loss | 27 | 23 | 26 | 27 | 13.4 | 11.4 |
| 10W40 OR Composition and Properties | | | | | | |
| DI, % | 11.6 | 11.6 | 11.60 | 11.6 | 11.60 | 11.60 |
| VI Improver Concentrate, % | 8.87 | 10.9 | 9.13 | 9.19 | 9.59 | 10.33 |
| Pour Point Depressant, % | 0.2 | 0.2 | 0.20 | 0.2 | 0.20 | 0.20 |
| 150N Base Oil, % | 48.57 | 47.3 | 48.41 | 48.37 | 48.13 | 47.67 |
| 100N Base Oil, % | 30.76 | 30 | 30.66 | 30.64 | 30.49 | 30.20 |
| Total | 100 | 100 | 100 | 100 | 100 | 100 |
| Kinematic Viscosity, cSt at 100 C. | 14.37 | 14.37 | 14.36 | 14.42 | 14.43 | 14.42 |
| CCS at −25 C., cP | 5574 | 6592 | 5315 | 5214 | 5880 | 5738 |
| MRV TP-1 at −30 C., cP | 39658 | 36682 | 25490 | 24612 | 27968 | 28465 |
| MRV Yield Stress, gms | 0 | 0 | 0 | 0 | 0.00 | 0.00 |
| Gelation Index, D5133G | 4.5 | 6.6 | 5.2 | 4.8 | 10.50 | 5.30 |
| TBS at 150 C., cP | 3.65 | 4.00 | 3.88 | 3.69 | 3.72 | 3.77 |

The foregoing Table 1 reports the advantageous viscometric properties seen as a result of using the styrene-butadiene star copolymer in a VI improver composition and a formulated 10W40 oil composition. The viscometric properties include low temperature properties such as the Cold Crank Simulator test (CCS) (ASTM D-5293) and Mini-Rotary Viscometer test (MRV) (ASTM D-4684). High temperature properties include thickening performance upon addition of the polymer and shear stability index (SSI) (ASTM D-6278).

Molecular weight of the polymers was measured with a Gel Permeation Chromatograph. Two Varian (Agilent) PLgel 5 um Mixed-C, 300×7.5 mm columns were used in series. Unstabilized THF at 40 degrees C. was used as the mobile phase. The column was calibrated with PSS (Polymer Standards Service) ReadyCal-Kit Polystryrene, (Calibration range=1090000-376), from which a 3rd order calibration curve was constructed; points above 1 million extrapolated from calibration curve.

Molecular weights of the arms and star may be measured separately and/or simultaneously. The number of arms in the star polymer is estimated by multiplying the weight average molecular weight of the star polymer by a factor or 1.2, then dividing this product by the weight average molecular weight of the arm polymer.

Special attention is drawn to the MRV test and results. During an MRV test, engine oil is cooled over predetermined ranges. The laboratory test results from the ASTM D-4684 test (MRV) have predicted as failures the known engine oils that have failed in the field because of lack of oil pumpability. Remarkably, the MRV test results of the oils having the styrene-butadiene star copolymer therein are significantly lower than (better than) the test results of oil having benchmark polymers therein. The test results report values less than 35,000, or, alternatively, less than 30,000.

It is also significant to note that the superior MRV performance that is shown is not offset by reduced kinematic viscosity (at 100° C.) test performance. In other words, the inventive Examples R-1, R-2, B-1, and B-2 all had generally equivalent kinematic viscosity (at 100° C.) performance results as the benchmark olefin copolymer examples of SV-261 and Lz 7077. However, the MRV performance improvement of the inventive compositions over the benchmark styrene isoprene star copolymers and olefin copolymers, diluted with the same base oil at approximately the same dilution level as the inventive VI improver, was at least 9000 cP, or alternatively at least 8000 cP, or still further alternatively at least 5000 cP. These differences reflect a substantial performance improvement over existing lubricants containing an olefin copolymer.

The previous data presented herein pertains to 10W40 oils. In the following tables, oils with remarkably different viscosity grades than 10W40 were blended with both Polymer Example R-1 and the benchmark example SV-261, the star polymer based on hydrogenated styrene-isoprene. The viscosity grades are 15W50 (Table 2), 5W30 (Table 3) and 0W20 (Table 4). In making the comparison for each grade, the DI, pour point depressant and base oil type (or ratio, if using a base oil mixture) were kept constant between Polymer R-1 and SV-261; similar KV100 and CCS were targeted for each grade of oil. As seen below, the Polymer R-1 consistently gives improved MRV performance over SV-261 in each case.

TABLE 2

| | Product | |
|---|---|---|
| | SV-261 | Polymer of Example R-1 |
| | Description | |
| | Star Polymer, Hydrogenated Styrene-Isoprene Block Copolymer | Star Polymer, Hydrogenated Styrene-Butadiene Random Copolymer |
| 15W50 Oil Composition and Properties | | |
| DI, % | 12.1 | 12.1 |
| VI Improver Concentrate, % | 11.47 | 11.31 |
| Pour Point Depressant, % | 0.1 | 0.1 |
| 150N Base Oil, % | 76.33 | 76.49 |
| Total | 100 | 100 |
| Kinematic Viscosity, cSt at 100 C. | 19.01 | 19.00 |
| CCS at −20 C., cP | 4999 | 4853 |
| MRV TP-1 at −25 C., cP | 47706 | 27308 |
| MRV Yield Stress, gms | 0 | 0 |

TABLE 3

| | Product | |
|---|---|---|
| | SV-261 | Polymer of Example R-1 |
| | Description | |
| | Star Polymer, Hydrogenated Styrene-Isoprene Block Copolymer | Star Polymer, Hydrogenated Styrene-Butadiene Random Copolymer |
| 5W30 Oil Composition and Properties | | |
| DI, % | 12.1 | 12.1 |
| VI Improver Concentrate, % | 6.6 | 6.5 |
| Pour Point Depressant, % | 0.1 | 0.10 |
| 150N Base Oil, % | 30.68 | 30.72 |
| 100N Base Oil, % | 50.52 | 50.58 |
| Total | 100 | 100 |
| Kinematic Viscosity, cSt at 100 C. | 10.9 | 10.80 |
| CCS at −30 C., cP | 5933 | 6197 |
| MRV TP-1 at −35 C., cP | 63531 | 23400 |
| MRV Yield Stress, gms | 10 | 0 |

TABLE 4

| | Product | |
|---|---|---|
| | SV-261 | Polymer of Example R-1 |
| | Description | |
| | Star Polymer, Hydrogenated Styrene-Isoprene Block Copolymer | Star Polymer, Hydrogenated Styrene-Butadiene Random Copolymer |
| 0W20 Oil Composition and Properties | | |
| DI, % | 12.1 | 12.1 |
| VI Improver Concentrate, % | 3.15 | 3.10 |
| Pour Point Depressant, % | 0.1 | 0.1 |
| 100N Base Oil, % | 84.65 | 84.70 |
| Total | 100 | 100 |
| Kinematic Viscosity, cSt at 100 C. | 7.53 | 7.47 |
| CCS at −35 C., cP | 5967 | 6224 |
| MRV TP-1 at −40 C., cP | 36304 | 15569 |
| MRV Yield Stress, gms | 0 | 0 |

This additional testing set forth in Tables 2-4 reinforces the MRV performance improvement noted earlier. The MRV performance improvement of the inventive compositions over the benchmark styrene isoprene star copolymers, diluted with the same base oil at approximately the same dilution level as the inventive V1 improver, was at least about 20,000 cP, or alternatively at least about 30,000 cP, or still further alternatively at least about 40,000 cP.

This invention is susceptible to considerable variation in its practice. Therefore the foregoing description is not intended to limit, and should not be construed as limiting, the invention to the particular exemplifications presented hereinabove. Rather, what is intended to be covered is as set forth in the ensuing claims and the equivalents thereof permitted as a matter of law.

That which is claimed is:

1. A lubricant comprising a viscosity index improver wherein
   a. the viscosity index improver comprises:
      a hydrogenated styrene butadiene star copolymer, wherein the star copolymer is formed from styrene and butadiene monomers in a ratio of about 5 to 13% styrene to about 95 to 87% butadiene by weight, further wherein the star copolymer has greater than 50% of 1,2 polymerization of the butadiene monomer;
      wherein the star copolymer core comprises divinylbenzene;
      wherein the degree of hydrogenation of the star copolymer is at least 95%;
      wherein the star copolymer has 3 or more arms and the molecular weight of each arm is more than 50,000;
      a base oil; and
      wherein the star copolymer is provided in an amount to be approximately 0.5 to 1.5 wt % of the lubricant; and
   b. the lubricant has a mini-rotary viscometer (MRV TP-1) value improvement of at least 5000 cP over a lubricant containing a hydrogenated styrene isoprene star polymer or an olefin copolymer at generally equivalent kinematic viscosity at 100° C.

2. The lubricant of claim 1, wherein the hydrogenated star polymer has about a 98% degree of hydrogenation.

3. The lubricant of claim 1, wherein the star copolymer has an average molecular weight (Mw) of at least about 700,000.

4. The lubricant of claim 1, wherein the ratio of styrene and butadiene monomers is about 10% styrene and 90% butadiene.

5. The lubricant of claim 1, wherein the star polymer comprises a hydrogenated, random styrene-butadiene copolymer.

6. The lubricant of claim 1, wherein the star polymer comprises a hydrogenated, styrene-butadiene block copolymer.

7. The lubricant of claim 1, wherein the base oil is a Group I base oil.

8. The lubricant of claim 1 having a mini-rotary viscometer value improvement of at least 8000 cP.

9. The lubricant of claim 1, wherein the lubricant comprises a Group I, Group II, Group III, or Group IV oil.

10. A method of improving the mini-rotary viscometer value (MRV TP-1) of a lubricant comprising the step of:
   mixing a lubricant with a viscosity index improver,
   wherein the viscosity index improver comprises:
   a. a hydrogenerated styrene butadiene star copolymer, wherein the star copolymer is formed from styrene and butadiene monomers in a ratio of about 5 to 13% styrene to about 95 to 87% butadiene by weight, further wherein the star copolymer has greater than 50% of 1,2 polymerization of the butadiene monomer, and still further wherein the star copolymer core comprises divinylbenzene;
   b. wherein the degree of hydrogenation of the star copolymer is at least 95% and further wherein the star copolymer has 3 or more arms and the molecular weight of each arm is more than 50,000;
   c. a base oil; and
   wherein the star copolymer is provided in an amount to be approximately 0.5 to 1.5 wt % of the lubricant.

11. The method of claim 10, further wherein the star copolymer comprises a hydrogenated, random styrene-butadiene copolymer.

12. The method of claim 10, further wherein the star copolymer comprises a hydrogenated, styrene-butadiene block copolymer.

13. The lubricant of claim 1, wherein the star copolymer is provided in an amount to be approximately 0.3 to 2 wt % of the lubricant.

14. The method of claim 10, wherein the star copolymer is provided in an amount to be approximately 0.3 to 2 wt % of the lubricant.

15. The method of claim 14, wherein the star copolymer is provided in an amount to be approximately 0.5 to 1.5 wt % of the lubricant.

\* \* \* \* \*